United States Patent [19]
Becker et al.

[11] Patent Number: 5,721,669
[45] Date of Patent: Feb. 24, 1998

[54] GEAR-DRIVEN DOCKING APPARATUS FOR REMOVABLE MASS-STORAGE DRIVES

[75] Inventors: William M. Becker, San Carlos; Sung H. Kim, Palo Alto, both of Calif.

[73] Assignee: Apple Computer, Inc., Cupertino, Calif.

[21] Appl. No.: 528,908

[22] Filed: Sep. 15, 1995

[51] Int. Cl.$^6$ ............................ G06F 1/16; H05K 7/14
[52] U.S. Cl. ............... 361/685; 74/89.17; 74/98; 74/409; 361/727
[58] Field of Search .................. 361/683–685, 361/607, 609, 724–727, 731, 732, 740, 741, 754, 755, 759, 796–798, 801; 364/708.1; 74/89.17, 98, 409; 29/464; 439/153, 157, 159, 160, 247, 248, 377

[56] References Cited

U.S. PATENT DOCUMENTS

| | | | |
|---|---|---|---|
| D. 311,737 | 10/1990 | Westwood et al. | D14/114 |
| 2,897,033 | 7/1959 | Ford . | |
| 3,784,954 | 1/1974 | Grimm et al. | 339/17 LM |
| 4,152,038 | 5/1979 | Inouye et al. | 339/75 M |
| 4,614,389 | 9/1986 | Albert et al. | 339/45 M |
| 4,633,350 | 12/1986 | Hanson | 360/98 |
| 4,717,982 | 1/1988 | Toreson et al. | 360/137 |
| 4,909,748 | 3/1990 | Kozono et al. | 439/247 |
| 4,912,580 | 3/1990 | Hanson | 360/98.01 |
| 4,926,365 | 5/1990 | Hsieh | 364/708 |
| 4,931,907 | 6/1990 | Robinson et al. | 361/391 |
| 4,939,622 | 7/1990 | Weiss et al. | 361/391 |
| 4,960,384 | 10/1990 | Singer et al. | 439/155 |
| 4,979,909 | 12/1990 | Andrews | 439/352 |
| 4,982,303 | 1/1991 | Krenz | 360/137 |
| 5,010,426 | 4/1991 | Krenz | 360/97.01 |
| 5,010,462 | 4/1991 | Mintzer | 362/109 |
| 5,035,634 | 7/1991 | Hasircoglu et al. | 439/157 |
| 5,045,960 | 9/1991 | Eding | 360/97.01 |
| 5,142,447 | 8/1992 | Cooke et al. | 361/685 |
| 5,155,662 | 10/1992 | I-Shou | 361/392 |
| 5,269,698 | 12/1993 | Singer | 439/157 |
| 5,325,263 | 6/1994 | Singer et al. | 361/683 |
| 5,432,496 | 7/1995 | Lin | 340/468 |

FOREIGN PATENT DOCUMENTS

1251350  8/1986  U.S.S.R. .

*Primary Examiner*—Lynn D. Feild
*Attorney, Agent, or Firm*—Blakely, Sokoloff, Taylor & Zafman

[57] ABSTRACT

A gear-driven docking apparatus for removable mass-storage drives comprises a guide rail, mounted inside a computer chassis, and a drive carrier, bearing a mass-storage drive. The drive carrier includes an alignment groove for slidingly receiving the guide rail and a gear train for engaging a rack profile formed at the proximal end of the guide rail. The rack profile and the gear train incorporate a mechanism that provides gear-and-rack synchronization under all operating conditions. Data and power connectors of the mass-storage drive are terminated to a printed circuit board that is movably attached to the drive carrier. The circuit board merges the separate power and data connectors into a single docking connector having registration pins.

17 Claims, 12 Drawing Sheets

FIG_1

FIG_3

FIG_4

FIG_5

FIG_6

FIG_7

FIG_9

FIG. 10

FIG_11

FIG_12

5,721,669

GEAR-DRIVEN DOCKING APPARATUS FOR REMOVABLE MASS-STORAGE DRIVES

BACKGROUND OF THE INVENTION

1. Field of the Invention

The present invention relates to mass storage systems, particularly to a docking apparatus for removable computer drives.

2. Description of Related Art

Mass storage of digital information is an essential feature of modern computer systems since the benefits of even the fastest microprocessor could not be realized without the ability to store data for current and future use. Various types of mass storage devices, such as magnetic-disk drives, magnetic-tape drives, and CD-ROM (compact-disk read-only-memory) drives, are currently available for business and personal applications.

Removable mass-storage drive modules are becoming increasingly popular in the computer industry due to their enhanced versatility. Such modules not only simplify maintenance and replacement of the drives for the users, but also make it easier to back up data and to transfer information from one computer to another because the modules can be removed from and introduced into a computer chassis without tools. Such modules also allow the user to upgrade the computer system without tools or assistance from others. Furthermore, removable drive modules allow improved data security since they can be detached from the computer and stored in a safe location. Unlike external drives, removable drive modules also enjoy the mechanical and electrical protection of the computer chassis without any of the maintenance and replacement disadvantages associated with fixed internal drives.

Various configurations of removable drive modules are currently known in the art. For example, in a rack-and-pinion-type module the rotary motion of a pinion gear is transformed into the linear motion of the module with respect to the computer chassis when the pinion gear engages a toothed rack element. One disadvantage associated with a number of rack-and-pinion removable-module designs is their inability to automatically ensure the proper synchronization of the rack and the pinion under all operating conditions. Mechanisms lacking this capability permit engagement of the rack and the pinion when the two are out of synchronization, thereby allowing incomplete docking of the drive module into the corresponding bay of the computer housing.

Another flaw affecting some of the rack-and-pinion devices stems from the necessity to provide the front portion of each removable module with an elongated slot to accommodate the travel of the pinion-actuating lever. The elongated slot is needed because the lever requires a long throw to deliver full engagement of the pinion gear with the toothed rack element. It is commonly known in the art that elongated solts in a computer housing allow electromagnetic radiation to escape, thus exposing computer users to harmful electromagnetic fields. Furthermore, EMI (electromagnetic interference) caused by the radiation emanating through such discontinuities adversely effects the performance of adjacently-located electronic devices.

Removable drive modules having pawl-and-latch engagement mechanisms are also known and used in the art. The main shortcoming common to many such systems relates to the limited range of engagement travel they provide, thus making it difficult to establish a positive coupling between the electrical connectors of the removable module and those of the computer housing. Furthermore, to achieve docking of the removable module, such mechanisms require the user to apply a force to the actuation lever that varies along the travel range thereof, which makes it difficult for the user to ascertain whether the docking procedure has been fully executed.

SUMMARY OF THE INVENTION

It is accordingly desirable to supply a docking apparatus for removable mass-storage drives that overcomes the foregoing drawbacks, e.g., that guarantees proper gear-and-rack synchronization under all operating conditions thereby ensuring that the removable drive module is fully docked into the chassis, attenuates electromagnetic radiation, and delivers a positive coupling between the electrical connectors of the removable drive and those of the computer chassis.

It is also desirable to provide a docking apparatus that would, for example, enable users to easily remove drives from and install drives into a computer chassis, allow docking of double-height drives, supply a common drive carrier that accommodates multiple drive configurations, minimize gear backlash, provide a sealed low-effort insertion/extraction mechanism that requires a constant force input and has a sufficient mechanical advantage to overcome electrical-connector mating forces, and be simple and inexpensive to manufacture.

Further advantages of the gear-driven docking apparatus for removable mass-storage drives will become apparent after consideration of the ensuing description and the accompanying drawings.

In one embodiment of the present invention, the docking apparatus comprises a guide rail, removably attached inside a drive bay of a computer chassis, and a drive carrier, bearing a mass-storage drive. The drive carrier includes an alignment groove for slidingly receiving the guide rail and a gear train for engaging a rack profile formed at the proximal end of the guide rail. The rack profile and the gear train incorporate a mechanism that ensures proper gear-and-rack synchronization under normal operating conditions. Data and power connectors of the mass-storage drive are terminated via cables to a transition PCB (printed circuit board) that is movably attached to the drive carrier. The PCB merges the separate power and data connectors into a single blind-matable docking connector having registration pins.

BRIEF DESCRIPTION OF THE DRAWINGS

The present invention is illustrated by way of example, and not by way of limitation, in the figures of the accompanying drawings, where.

For purposes of illustration, these figures are not necessarily drawn to scale. In all of the figures, like components are designated by like reference numerals.

DETAILED DESCRIPTION OF THE INVENTION

Throughout the following description, specific details are set forth in order to provide a more thorough understanding of the invention. However, the invention may be practiced without these particulars. In other instances, well known elements have not been shown or described to avoid unnecessarily obscuring the present invention. Accordingly, the specification and drawings are to be regarded in an illustrative, rather than a restrictive, sense.

Figure 1:
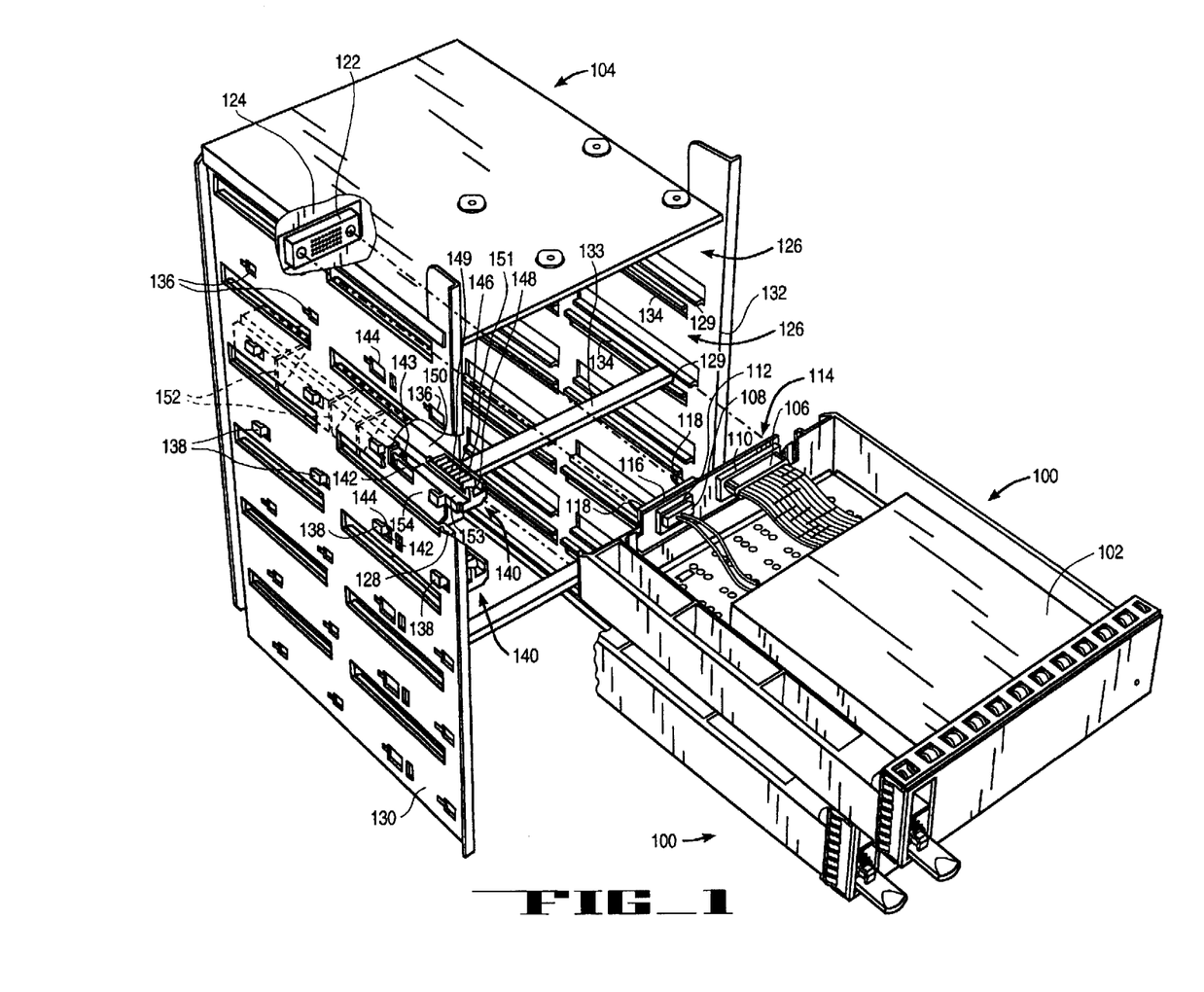
FIG. 1 is a perspective view of a gear-driven docking apparatus for removable mass-storage drives according to one embodiment of the present invention.

FIG. 1 is a perspective view of a gear-driven docking apparatus for removable mass-storage drives according to one embodiment of the present invention. The docking apparatus includes a plurality of drive carriers 100 each bearing a removable mass-storage drive 102 for insertion into a metal computer chassis 104. Mass-storage drive 102 may comprise a hard disk drive, a floppy disk drive, a tape drive, a CD-ROM drive, an optical disk drive, or any other mass-storage device. Drive carriers 100 may also be used for docking various removable computer components, such as circuit cards.

Mass-storage drive 102 includes a data connector 106 and a power connector 108 terminated into corresponding data and power jacks 110 and 112 of a transition PCB (printed circuit board) 114. The function of printed circuit board 114 is to merge the separate data and power jacks into a single docking connector 116 that is located on the opposite side of the board and has a pair of registration pins 118. When drive carrier 100 is fully inserted into chassis 104, docking connector 116 blindly mates with a corresponding chassis jack 122, thus electrically coupling mass-storage drive 102 with chassis 104. A plurality of chassis jacks 122 is mounted on a back plane 124 of chassis 104.

As illustrated in FIG. 1, chassis 104 possesses several drive bays 126, each having an opposing pair of lower longitudinal ribs 128 and 129 formed on side walls 130 and 132 of chassis 104, respectively, and an upper longitudinal rib 134 located along one of the lateral walls, e.g., side wall 132. Transverse beams 133 couple the inner surfaces of side walls 130 and 132 to provide chassis 104 with lateral rigidity. Each drive bay 126 has several keyholes 136 formed along side wall 130 for receiving keyhole tabs 138 of a guide rail 140, a plurality of which is removably mounted inside chassis 104. Guide rails 140 may be made of ABS (Acrilonitrile-Butadiene-Styrene) plastic. Each guide rail includes a saw-tooth retention snap 142 that engages an oversize keyhole 144. Saw-tooth retention snap 142 has a pull tab 143, positioned on the inside surface of the saw-tooth retention snap. Pull tab 143 is used to disengage saw-tooth retention snap 142 from oversize keyhole 144 if one of guide rails 140 needs to be removed from computer chassis 104.

The proximal end of each guide rail 140 incorporates a rack profile 146 preceded by a lockout key 148, located laterally with respect to the rack profile. A groove 149, extending laterally along one side of rack profile 146, is formed posterior to lockout key 148. Rack profile 146 is contiguous with a smooth rectangular guiding portion 150, having a longitudinal strip 151 that laterally extends along the other side of rack profile 146. To reinforce guide rail 140, a plurality of transverse triangular ribs 152 interconnect guiding portion 150 and a side portion 154 of guide rail 140. A fillet 153 separates side portion 154 and rectangular guiding portion 150. For additional stability of guide rail 140, side portion 154 rests on top of lower longitudinal rib 128.

Figure 2:
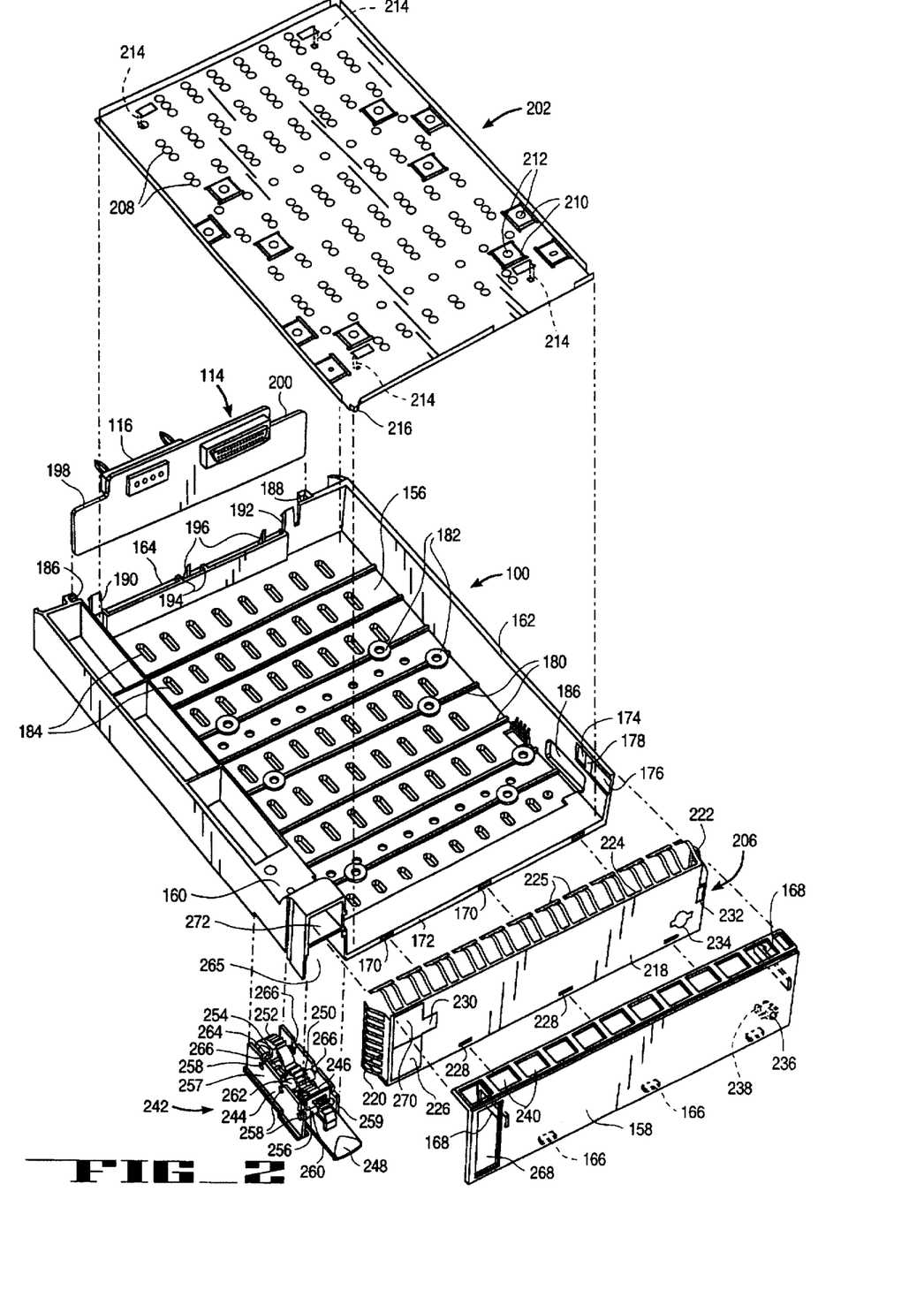
FIG. 2 is an exploded top perspective view illustrating a drive carrier of the gear-driven docking apparatus of FIG. 1.

As shown in FIG. 2, drive carrier 100 includes a base portion 156, a removable L-shaped panel 158, side portions 160 and 162, and a leading portion 164. L-shaped panel 158 possesses locating protrusions 166 and saw-tooth retention snaps 168. To demountably attach L-shaped panel 158 to drive carrier 100, locating protrusions 166 must be inserted into corresponding slots 170, positioned along a trailing edge 172 of drive carrier 100, and saw-tooth retention snaps 168 must engage retaining openings 174 (only one of which is shown), formed in side portions 160 and 162. To facilitate the engagement of saw-tooth retention snaps 168 and retaining openings 174, the inner surfaces of side portions 160 and 162 are provided with longitudinal grooves 176. Oblique detents 178 (only one of which is shown) are situated in longitudinal grooves 176 contiguously with retaining openings 174 to deliver a positive engagement of saw-tooth retention snaps 168 and retaining openings 174 as well as to prevent saw-tooth retention snaps 168 from outwardly protruding through retaining openings 174.

Base portion 156 includes a plurality of transverse reinforcement ribs 180 as well as a plurality of reinforced mounting openings 182 for receiving fasteners (not shown) inserted from the exterior of drive carrier 100 to engage corresponding mounting holes (not shown) of mass-storage drive 102 (illustrated in FIG. 1). Base portion 156 also possesses a multiplicity of ventilation openings 184 whereas side portion 162 has a rectangular vent 186.

Leading portion 164 contains vertical channels 186 and 188 for supporting printed circuit board 114, which is retained in the vertical channels by saw-tooth capture snaps 190 and 192. A first plurality of ribs 194 prevents excessive bending of circuit board 114 when docking connector 116 mates with chassis connector 122 (shown in FIG. 1). Similarly, a second plurality of ribs 196 bolsters circuit board 114 when docking connector 116 disengages chassis connector 122. The spacing between channels 186 and 188 is greater than the length of printed circuit board 114 and the engagement range of saw-tooth capture snaps 190 and 192 exceeds the height of PCB shoulders 198 and 200. Therefore, printed circuit board 114 is able to "float" approximately 1.5 mm vertically and horizontally in a plane defined by vertical channels 186 and 188.

Drive carrier 100 is provided with a metal plane 202 and a metal shield 206 for grounding mass-storage drive 102 to computer chassis 104 (shown in FIG. 1) and for containing electromagnetic radiation emanating from computer chassis 104. Metal plane 202 comprises a multiplicity of openings 208, corresponding to ventilation openings 184 of base portion 156, and a plurality of raised portions 210 having openings 212 that coincide with reinforced mounting holes 182 of base portion 156. Metal plane 202 is demountably attached to base portion 156 via resilient tabs 214 that engage matching ventilation openings 184. A resilient finger 216 is formed at the trailing edge of metal plane 202 for engaging metal shield 206 that comprises a main portion 218, resilient side portions 220 and 222, a top portion 224 having resilient elements 225, and a flat bottom portion 226. To accommodate locating protrusions 166 of L-shaped panel 158, main portion 218 includes corresponding apertures 228. Moreover, main portion 218 has openings 230 and 232 for receiving saw-tooth retention snaps 168. Metal shield 206 and L-shaped panel 158 also contain openings 234 and 236 to provide visual access to a light-emitting diode (not shown) of mass-storage drive 102. The LED is attached to L-shaped panel 158 via a retaining jack 238. A plurality of rectangular openings 240 is formed in the top section of L-shaped panel 158 to allow resilient elements 225 to protrude therethrough for engaging either computer chassis 104 (shown in FIG. 1) or flat bottom portion 226 of metal shield 206 belonging to another drive carrier located in a neighboring drive bay above.

Side portion 160 retains a gear train 242, packaged in a gear-train housing 244 that is permanently anchored within side portion 160 by an ultrasonic-welding process. The method of ultrasonically welding plastic components together is superior to known permanent bonding methods in that it provides a greater bonding strength than do adhesives and requires no additional time for the bond to set. Accordingly, the assembly process is appreciably expedited.

Gear train 242 comprises a partial input-drive gear 246 having an actuation lever 248, an idler gear 250, meshing with input-drive gear 246, and an output-drive gear 252, meshing with idler gear 250. Output-drive gear 252 includes a lockout cam ring 254 comprising a smooth annular segment located laterally with respect to the cogged portion of output-drive gear 252 and having the same diameter as the cogged portion of the output-drive gear. Input-drive gear 246 has a flared tooth member 256. The functions of lockout cam ring 254 and flared tooth member 256 will be described in detail below. Input-drive gear 246 and output-drive gear 252 have the same diameter, which is approximately 21.5 mm, while idler gear 250 has a smaller diameter of approximately 13.7 mm. The length of actuation lever 248 is twice the diameter of input-drive gear 246, providing a two-to-one mechanical advantage for overcoming the mating forces between docking connector 116 and chassis jack 122 (shown in FIG. 1). The coupling and decoupling of docking connector 116 and chassis jack 122 is achieved by applying a constant-force to actuation lever 248. Gear train 242 delivers smooth and predictable engagement of actuation lever 248 throughout the range of its travel, which comprises approximately ninety degrees of rotational motion.

Gear-train housing 244 possesses openings 258 located in walls 257 and 259 of the gear-train housing for rotationally supporting gear shafts 260, 262, and 264. Gear-train housing 244 further includes oblique channels 266 to facilitate insertion of gear shafts 260, 262, and 264 into openings 258. Walls 257 and 259 of gear-train housing 244 have sufficient flexibility to allow gear shafts 260, 262, and 264 to snap into the corresponding openings 258. Once gear train 242 is permanently installed inside a cavity 265 located at the proximal end of side portion 160, the gears are securely retained within gear-train housing 244. Access openings 268 and 270 are formed in L-shaped panel 158 and metal shield 206, respectively, to allow actuation lever 248 to protrude therethrough. Due to the comparatively small size of input-drive gear 246 and lever 248, opening 270 in metal shield 206 has a relatively small area of about eight square centimeters, thus minimizing electromagnetic radiation that emanates through opening 270. Side portion 160 incorporates a pocket 272 that provides access to actuation lever 248 when it is rotated flush with front panel 158. Pocket 272 is defined by a horizontal rib 274 that serves as a stop for actuation lever 248 and ensures the user's safety by restricting access to gear train 242.

Figure 3:
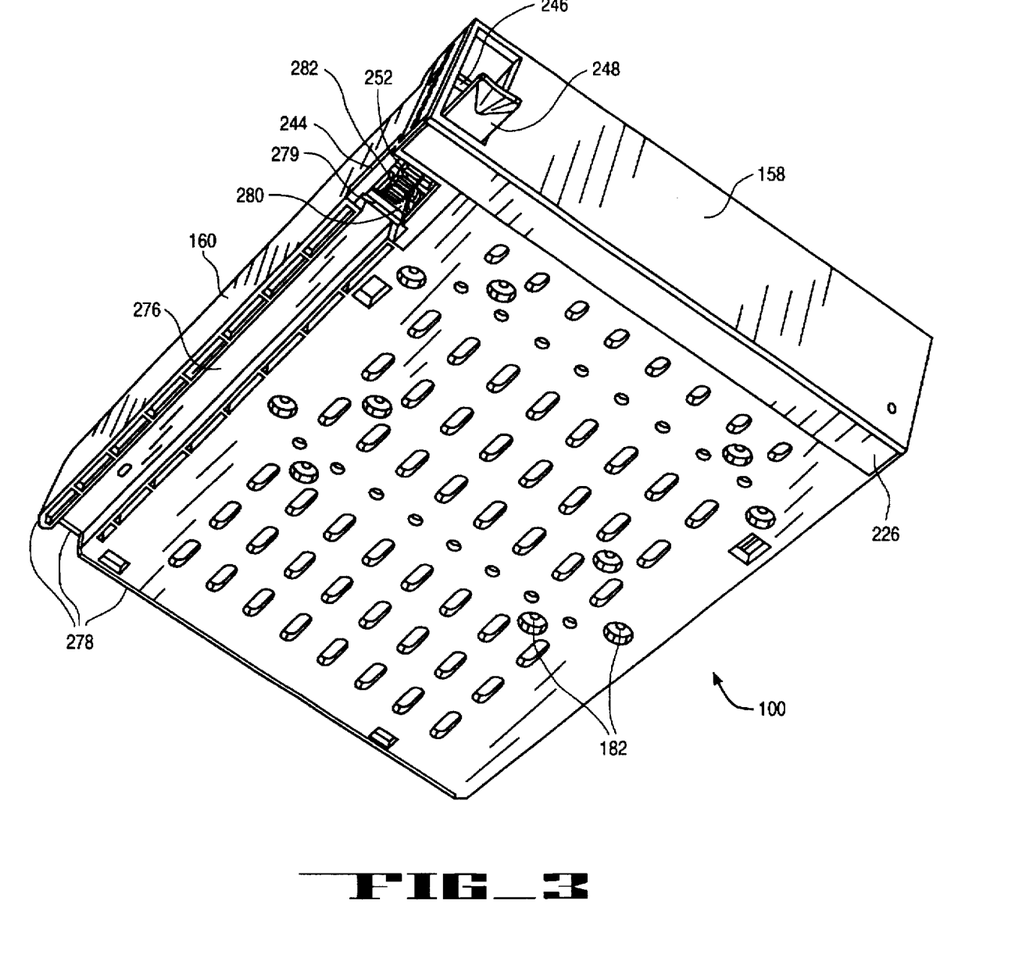
FIG. 3 is a bottom perspective view of the drive carrier of FIG. 2.

FIG. 3 is a bottom perspective view of drive carrier 100 depicting an alignment groove 276 formed in side portion 160 for engaging rectangular guiding portion 150 of guide rail 140 (shown in FIG. 1) with a precision fit. To facilitate both insertion of drive carrier 100 into one of drive bays 126 and engagement of alignment groove 276 with rectangular guiding portion 150 of guide rail 140, a chamfer 278 is formed along the leading edge of drive carrier 100. It is apparent from FIG. 3 that reinforced mounting openings 182 are recessed to prevent the heads of the fasteners (not shown), used to attach mass-storage drive 102 (shown in FIG. 1) to drive carrier 100, from interfering with a neighboring drive carrier located in a drive bay immediately below.

FIG. 3 also shows gear-train housing 244 installed into drive carrier 100. Gear-train housing 244 contains a crossbrace 279 and a rectangular opening 280 that allows output-drive gear 252 to engage rack profile 146 (shown in FIG. 1) of guide rail 140. A torsion spring 282, one end of which is coupled to output-drive gear 252 and the other to the interior of gear-train housing 244, biases actuation lever 248 into a horizontal position illustrated in FIG. 3. Because torsion spring 282 preloads the entire gear train and not just input-drive gear 246, backlash (i.e., play) in gear train 242 is eliminated, thus minimizing gear noise and vibration.

Figure 4:
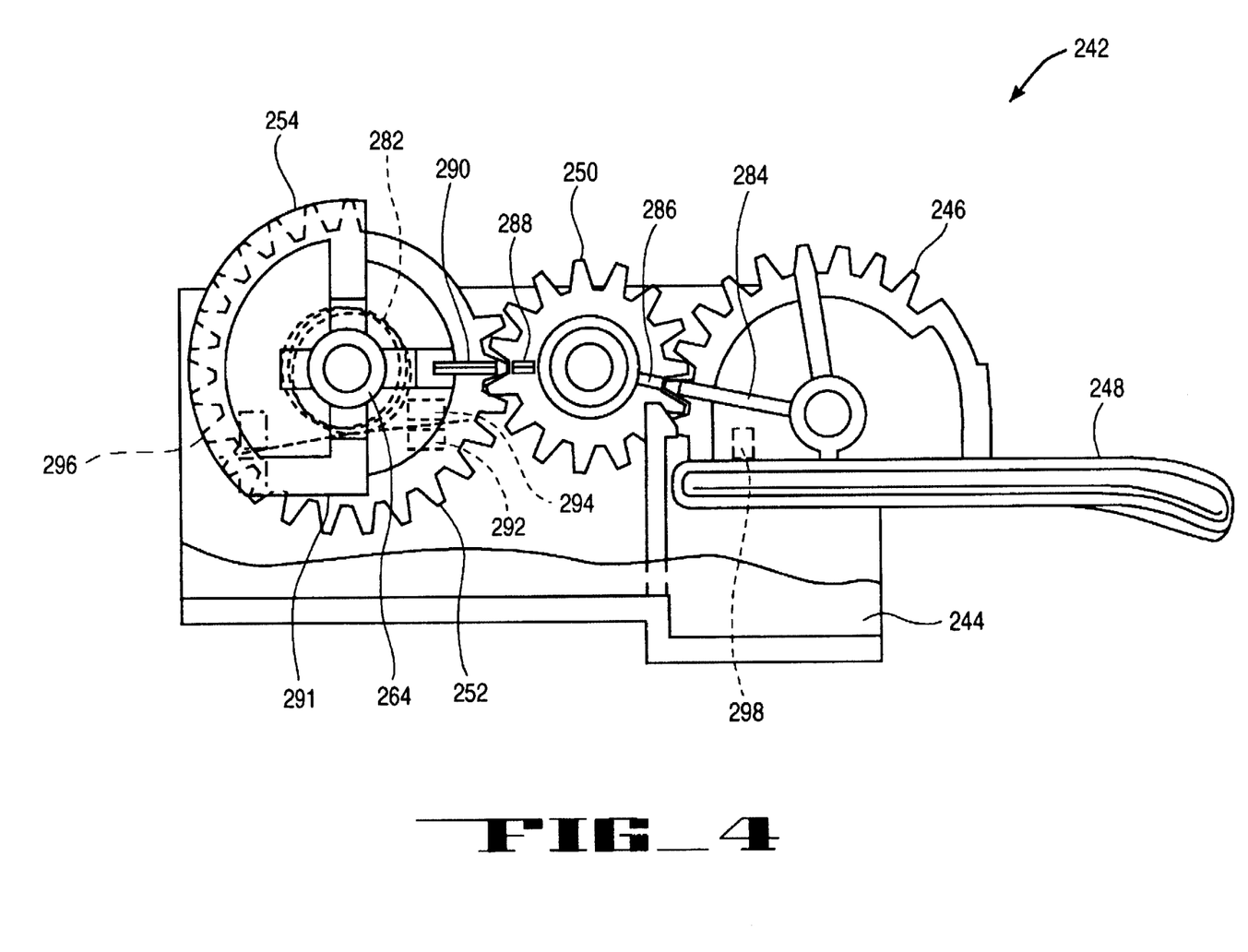
FIG. 4 is a side view of a gear train incorporated in the drive carrier of FIG. 1.

As shown in FIG. 4, gear train 242 includes a plurality of timing marks to facilitate the assembly of the gear train. Specifically, during installation of gear train 242 into gear-train housing 244, a first radial timing mark 284 formed on input-drive gear 246 must align with a second radial timing mark 286 formed on idler gear 250. Similarly, a third radial timing mark 288 formed on idler gear 250 must align with a fourth radial timing mark 290, formed on output-drive gear 252. To facilitate assembly of gear train 242, first and second radial timing marks 284 and 286 have smooth surfaces whereas third and fourth radial timing marks 288 and 290 have angular surfaces. It is apparent from FIG. 4 that when all the timing marks are properly aligned and actuation lever 248 is in a horizontal position, a flat 291 formed in lockout cam ring 254 also possesses a horizontal orientation.

Torsion spring 282, which preloads gear train 242 so as to bias actuation lever 248 to a horizontal position, coils around gear shaft 264. One end of torsion spring 282 is maintained between posts 292 and 294, formed along one of the side faces of output-drive gear 252, while the other end of the torsion spring rests in a slotted tab 296, protruding from the interior of gear-train housing 244. A pair of limit stops 298, engaging actuation lever 248 on both sides thereof, ensure that torsion spring 282 does not bias actuation lever 248 past the horizontal position.

Figure 5:
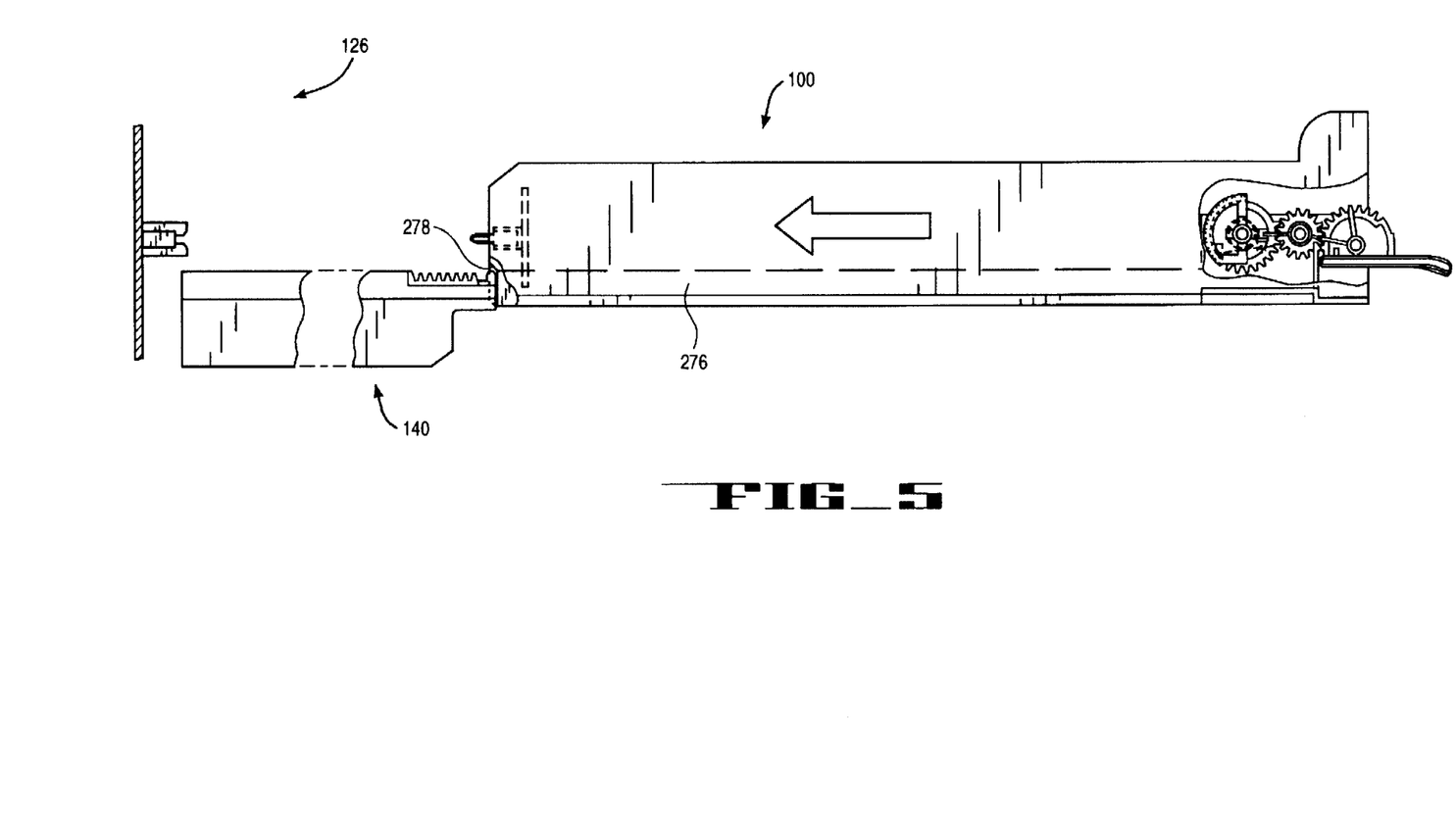
FIG. 5 is a side view of the drive carrier of FIG. 1 positioned to engage a guide rail of a computer chassis.
Figure 6:
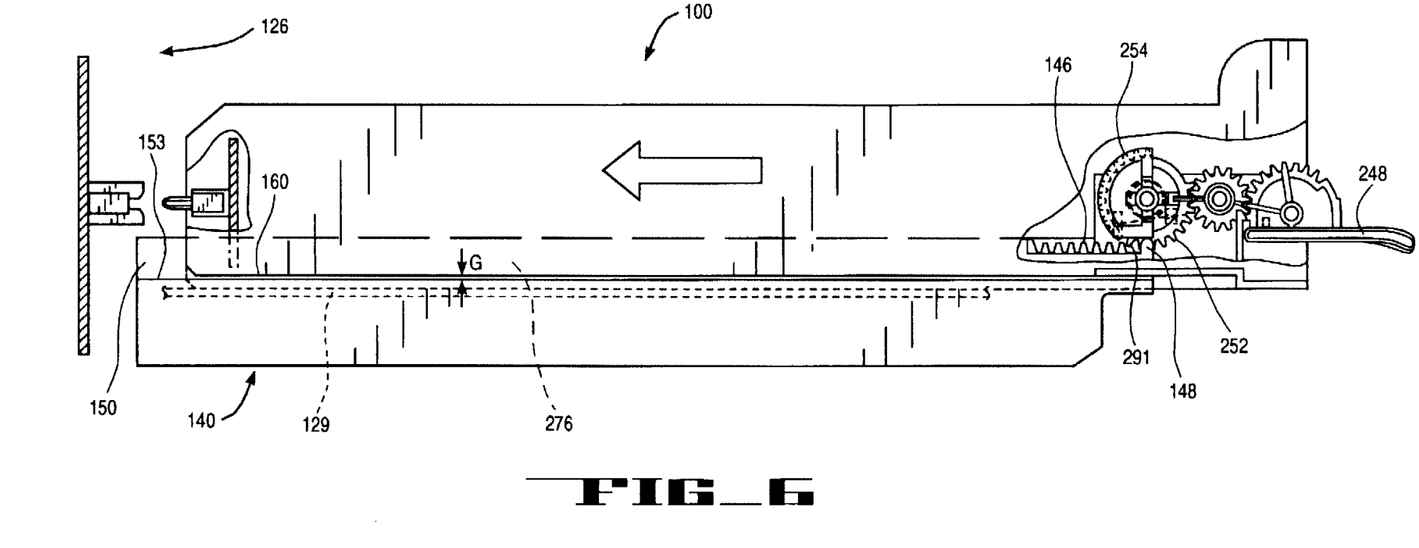
FIG. 6 is a side view of the drive carrier of FIG. 1 wherein the gear train is ready to engage a rack profile formed on the guide rail.

It is apparent from FIG. 5 that chamfer 278 facilitates the engagement of guide rail 140 and alignment groove 276. During insertion of drive carrier 100 into one of the drive bays 126 for the purpose of docking mass-storage drive 102 to computer chassis 104 (shown in FIG. 1), rectangular guiding portion 150 of guide rail 140 provides the primary alignment of drive carrier 100 within drive bay 126 (FIG. 6). By using a single guide rail 140 for alignment of the drive carrier as opposed to utilizing a pair of separate guiding elements located at the opposite sides of computer chassis 104, alignment accuracy is maximized because dimensional variations, e.g., in straightness, associated with one side of the metal chassis are half those associated with both sides.

Once drive carrier 100 is inserted into computer chassis 104 (shown in FIG. 1), rectangular guiding portion 150 of guide rail 140 engages alignment groove 276 with a precision fit (FIG. 6). Rectangular guiding portion of guide rail 140 aligns drive carrier 100 inside drive bay 126 and supports one side thereof whereas lower longitudinal rib 129 supports the other side of the drive carrier. When lever 248 is in a horizontal position, lockout cam ring 254 of output-drive gear 252 clears lockout key 148, formed at the proximal end of guide rail 140, thus allowing output-drive gear 252 and rack profile 146 to mesh together. As illustrated in FIG. 6, lockout cam ring 254 does not interfere with lockout key 148 since there is a clearance fit between flat 291 of lockout cam ring 254 and lockout key 148 when flat 291 is in the horizontal position. To ensure a precision fit between rectangular guiding portion 150 and alignment groove 276, a gap G of at least 0.25 mm separates the bottom edge of side portion 160 and fillet 153 to prevent any interference between guide rail 140 and drive carrier 100.

Figure 7:
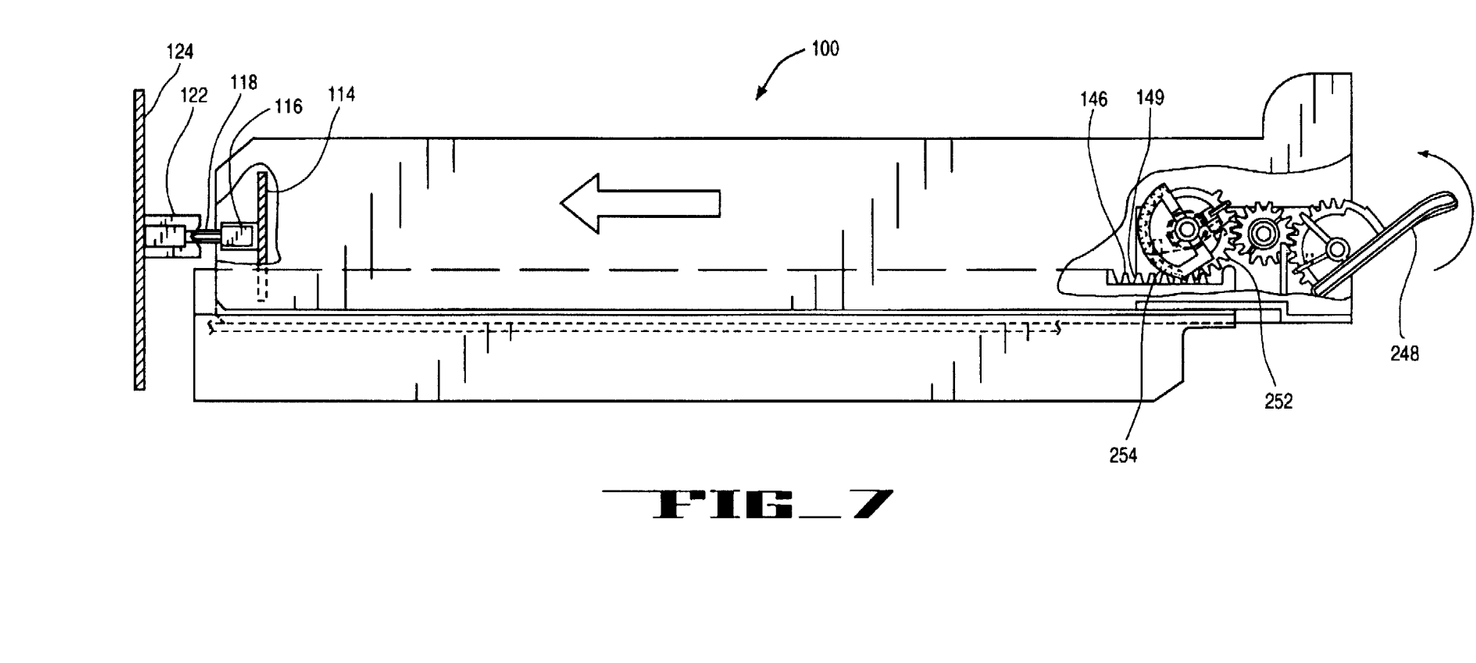
FIG. 7 is a side view of the drive carrier of FIG. 1 wherein the gear train is engaging the rack profile of the guide rail in the direction of the back plane of the computer chassis.

As output-drive gear 252 begins to mesh with rack profile 146, the final stage of the docking procedure is implemented by rotating actuation lever 248 upward (FIG. 7). Rotation of actuation lever 248 toward a vertical position causes output-drive gear 252 to mesh with rack profile 146, thus propelling drive carrier 100 toward back plane 124 of computer chassis 104, whereby registration pins 118 of docking connector 116 begin to engage the corresponding openings of chassis jack 122. The ability of printed circuit board 114 to "float" in the vertical and lateral directions with respect to drive carrier 100 enables registration pins 118 to provide fine alignment of docking connector 116 and chassis jack 122. When output-drive gear 252 is meshing with rack profile 146, lockout cam ring 254 rolls along groove 149 with a clearance fit. Groove 149 is provided to allow continuous meshing of output-drive gear 252 and rack profile 146 without interference between lockout cam ring 254 and rack profile 146.

Figure 8:
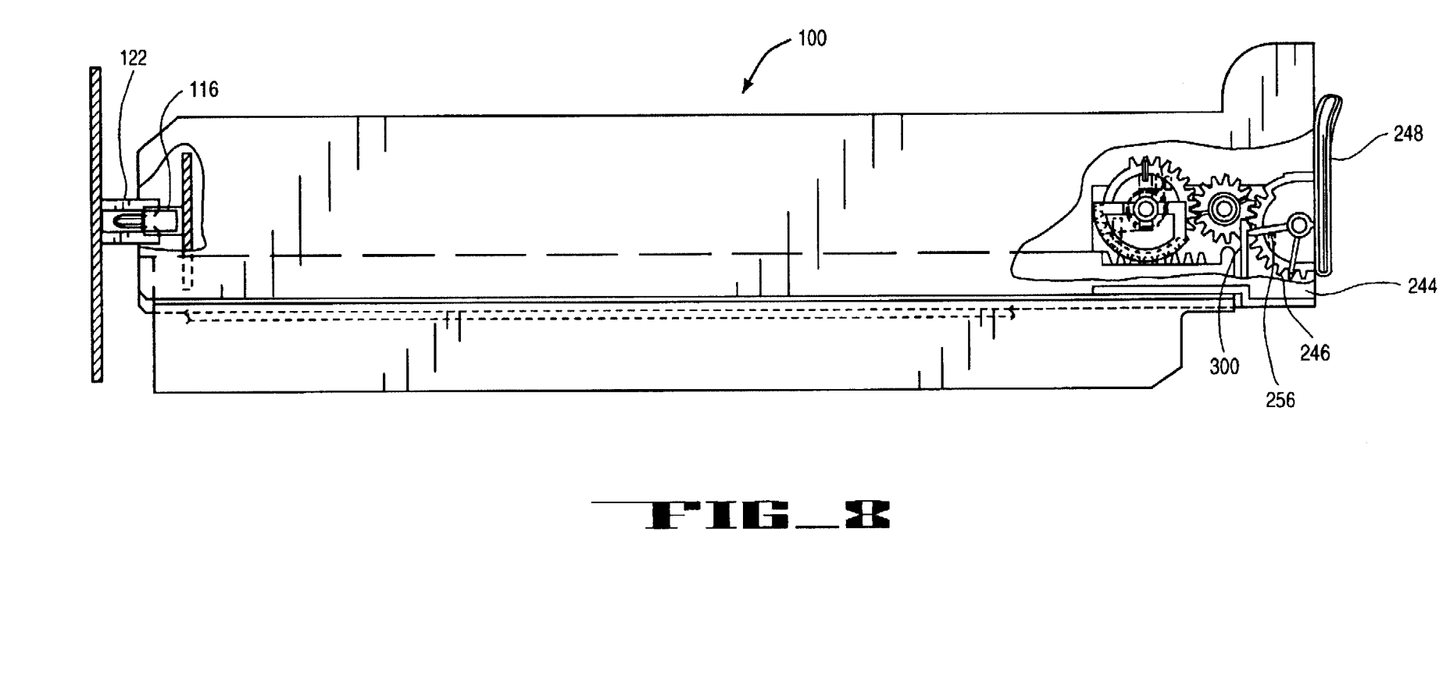
FIG. 8 is a side view of the drive carrier of FIG. 1 wherein the gear train has fully engaged the rack profile of the guide rail.

As shown in FIG. 8, the docking procedure is completed once actuation lever 248 is rotated to the vertical position, whereby docking connector 116 fully engages chassis jack 122 and flared tooth member 256 of input drive gear 246 clicks past a saw-tooth detent 300, formed inside gear-train housing 244. The engagement of flared tooth member 256 and saw-tooth detent 300 provides tactile feedback through actuation lever 248, indicating that the docking procedure has been fully executed.

Figure 9:
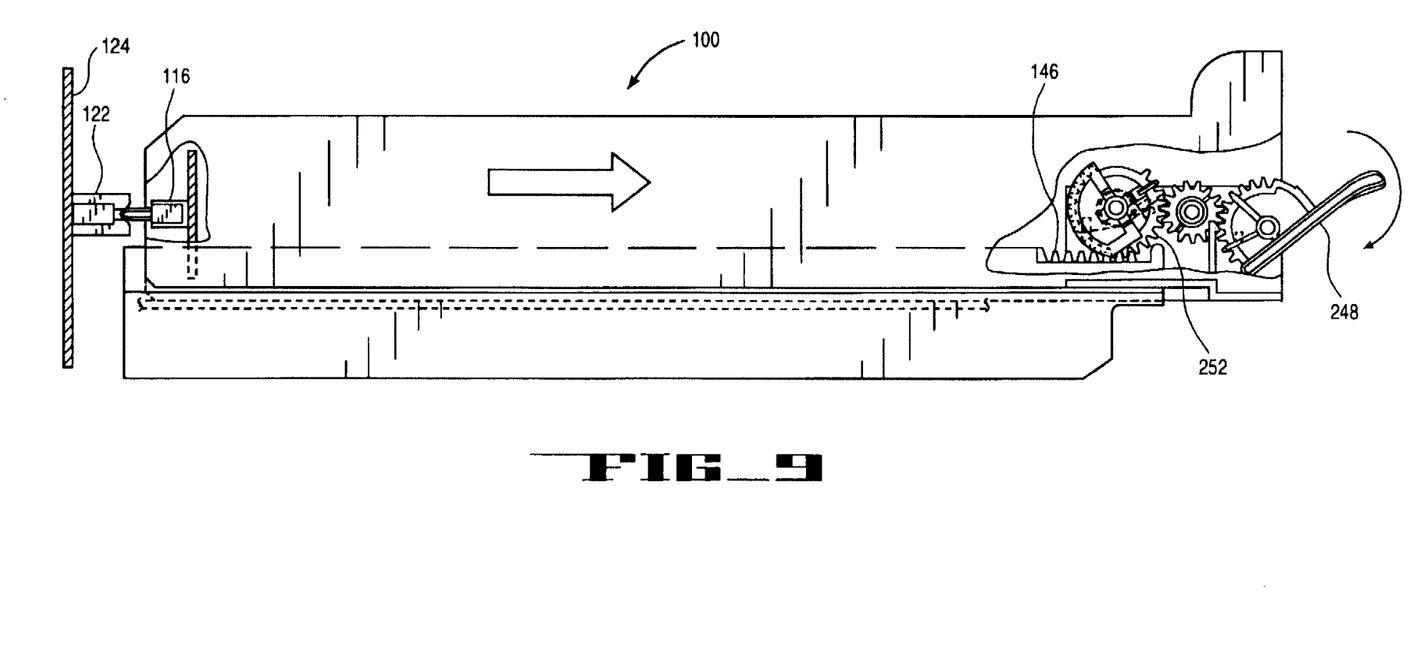
FIG. 9 is a side view of the drive carrier of FIG. 1 wherein the gear train is engaging the rack profile of the guide rail in the direction away from the back plane of the computer chassis.

Detachment of drive carrier 100 from computer chassis 104 is initiated by rotating actuation lever 248 toward the horizontal position (FIG. 9). This movement of actuation lever 248 causes output-drive gear 252 to engage rack profile 146 in the direction away from back plane 124 of computer chassis 104, thus decoupling docking connector 116 from chassis jack 122. When actuation lever 248 is rotated so that it is in the horizontal position, output-drive gear 252 disengages rack profile 146 and drive carrier 100 may be pulled out of drive bay 126.

Figure 10:
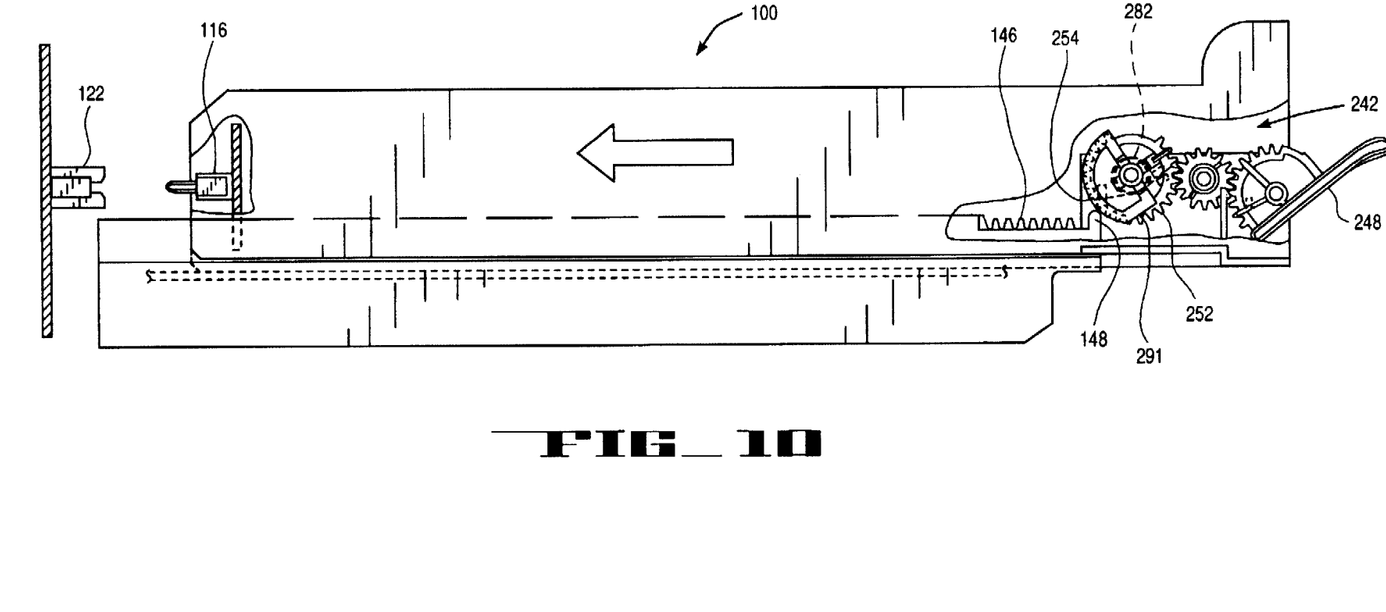
FIG. 10 is a side view of the drive carrier of FIG. 1 wherein the gear train is locked out from engaging the rack profile of the guide rail.

FIG. 10 illustrates an attempt to insert drive carrier 100 into the chassis when actuation lever 248 is not in a horizontal position. If actuation lever 248 is accidentally maintained approximately three or more degrees away from the horizontal position, output-drive gear 252 is incapable of engaging rack profile 146 because flat 291 is not in a horizontal position, resulting in an interference fit between lockout key 148 and lockout cam ring 254. This lock-out feature guarantees synchronization between gear train 242 and rack profile 146 under all operating conditions and thus prevents incomplete insertion of drive carrier 100 into the chassis and ensures a positive electrical connection between docking connector 116 and chassis jack 122. However, since torsion spring 282 automatically biases flat 291 and actuation lever 248 to a horizontal position, situations in which lockout key 148 interferes with lockout cam ring 254 are limited to those where actuation lever 248 is actively maintained away from the horizontal orientation.

Figure 11:
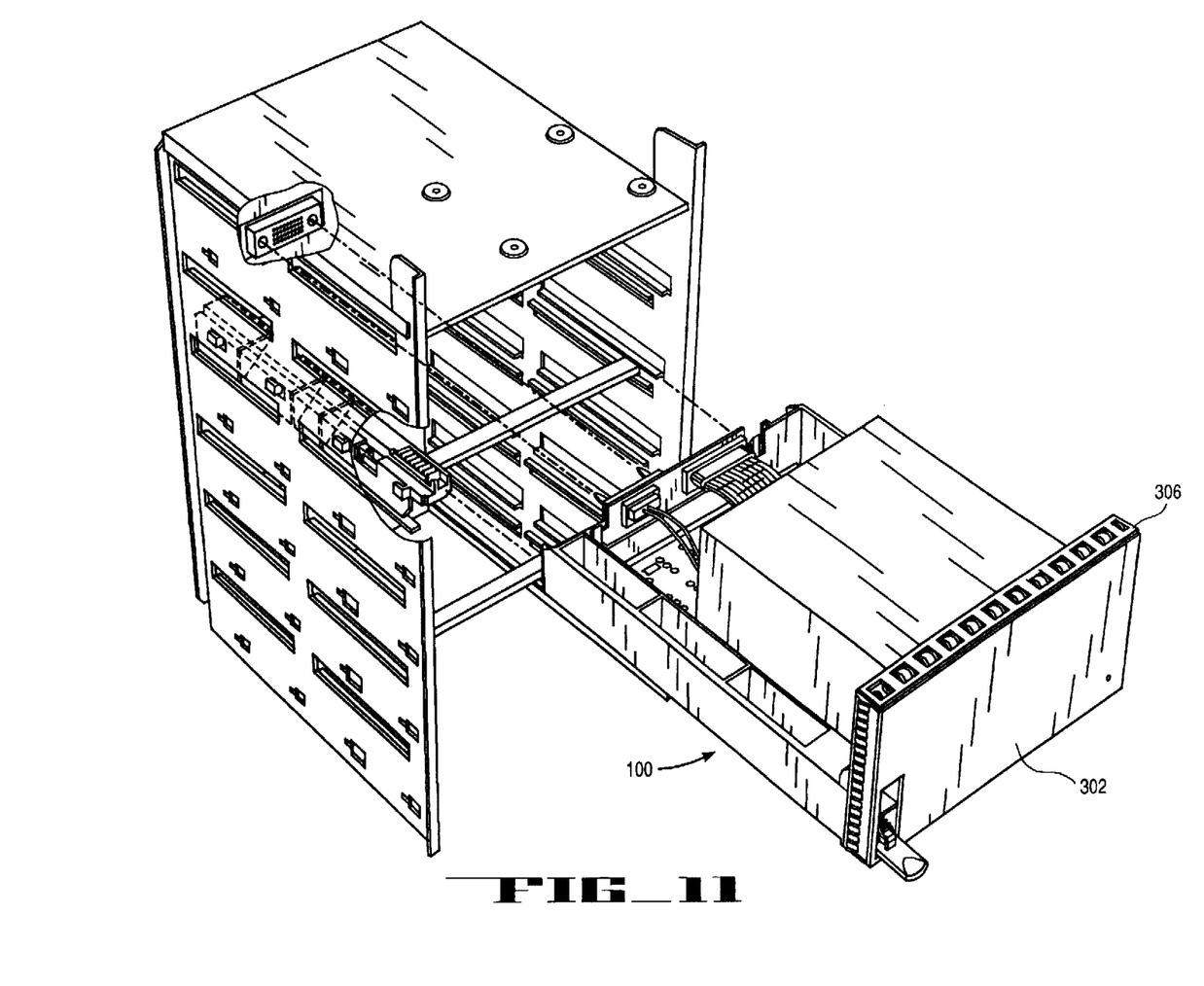
FIGS. 11 and 12 illustrate alternative configurations of removable panels that may be utilized with the drive carrier of FIG. 1.
Figure 12:
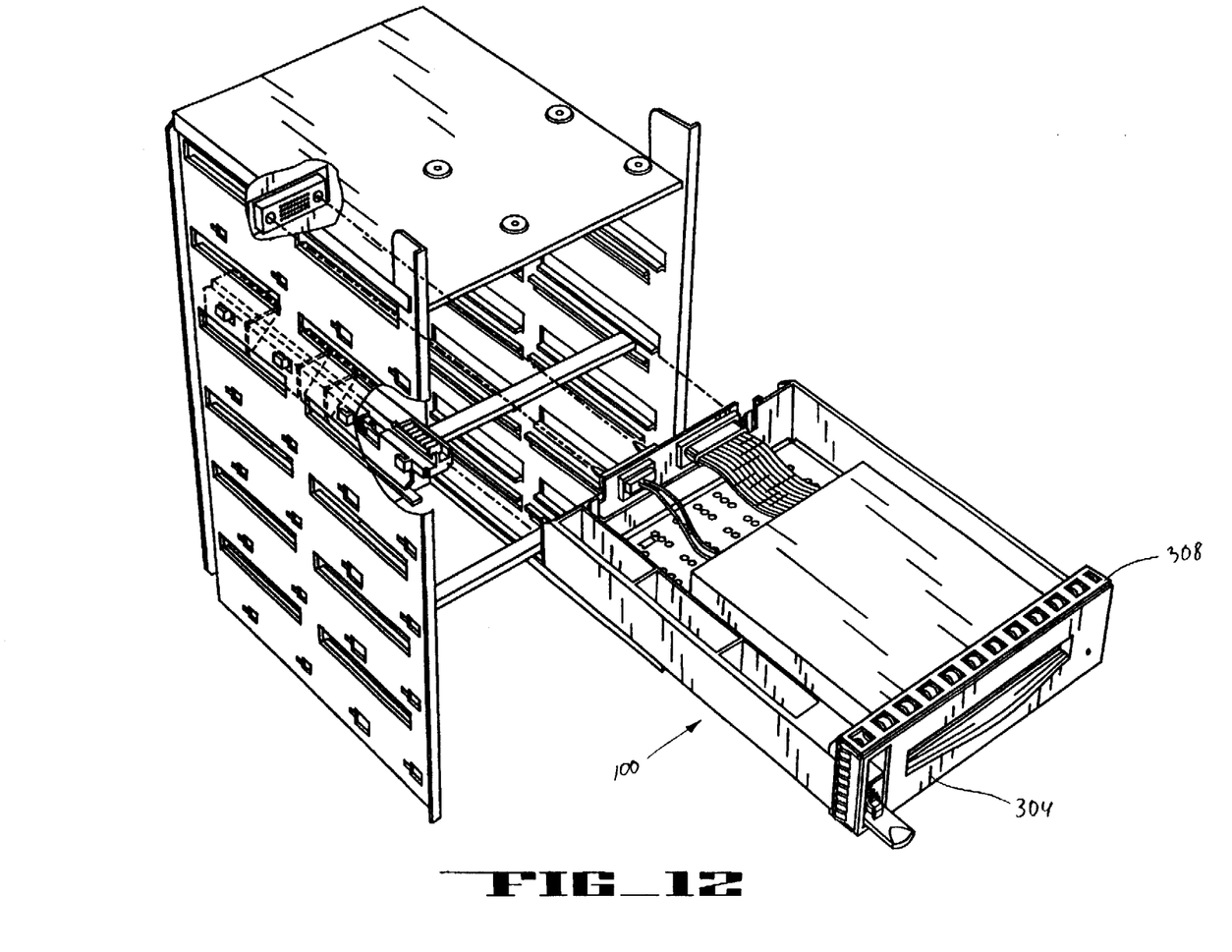

Many different modifications of the gear-driven docking apparatus for removable mass-storage drives are possible. For instance, if a double-height or a CD-ROM drive has to be mounted onto drive carrier 100, L-shaped panel 158 may be replaced with a double-height panel 302 or a slotted access panel 304, as shown in FIGS. 11 and 12, respectively, having correspondingly shaped radiation shields 306 and 308.

If necessary, printed circuit board 114 may be easily removed and replaced with a printed circuit board having a different number and type of connectors. Furthermore, instead of permanently bonding gear-train housing 244 to drive carrier 100, it is possible to removably attach the gear-train housing to the drive carrier through a system of, e.g., snap-in fasteners.

The above configurations of the gear-driven docking apparatus for removable mass-storage drives are given only as examples. Therefore, the scope of the invention should be determined not by the illustrations given, but by the appended claims and their equivalents.

What is claimed is:

1. A docking apparatus, comprising:
    carrier means for supporting a removable mass-storage drive;
    alignment means for guiding said carrier means into a computer chassis;
    drive means for docking said carrier means in said computer chassis;
    regulatory means for synchronizing said drive means;
    wherein said alignment means comprises a guide rail rigidly and removably mounted in said computer chassis and an alignment groove formed in said carrier means to slidingly engage said guide rail;
    wherein said drive means comprises a gear train incorporated in said carrier means and a rack profile formed at a proximal end of said guide rail;
    wherein said gear train comprises an input-drive gear having an actuation lever, an idler gear meshing with said input-drive gear, and
    an output-drive gear meshing with said idler gear; and
    wherein said regulatory means comprises a lockout cam ring formed on said output-drive gear and a lockout key formed on said guide rail to prevent engagement of said output-drive gear and said rack profile by interfering with said lockout cam ring when said output drive gear is not synchronized with said rack profile.

2. The docking apparatus of claim 1 wherein said regulatory means further includes timing marks located on said input drive gear, said idler gear, and said output drive gear to synchronize said gear train during assembly.

3. The docking apparatus of claim 1 wherein said gear train further includes resilient means for preventing backlash in said gear train and for biasing said gear train so that said actuation lever is in a horizontal position prior to insertion of said carrier means into said computer chassis.

4. The docking apparatus of claim 3 wherein said lockout cam ring clears said lockout key when said actuation lever is in said horizontal position, allowing engagement of said output-drive gear and said rack profile.

5. A docking apparatus for a removable mass-storage drive comprising:

carrier means for supporting removable mass-storage drive, said carrier means is removably mounted in a computer chassis alignment means for guiding said carrier means into said computer chassis; drive means for docking said carrier means in said computer chassis; and regulatory means for synchronizing said first element to said second element of said drive means, wherein said carrier means is capable of utilizing any one of a plurality of interchangeable front panels having various geometries to accommodate removable mass-storage drives of different types and configurations.

6. The docking apparatus of claim 5 wherein said carrier means includes shielding means for attenuating electromagnetic radiation and for grounding said removable mass-storage drive to said computer chassis.

7. An apparatus for docking a removable mass-storage drive in a drive bay of a computer chassis, said apparatus comprising:

a guide rail mounted in a drive bay of a computer chassis;

a drive carrier having an alignment groove formed to slidingly engage said guide rail;

a gear train incorporated into said drive carrier; and a rack profile located at a proximal end of said guide rail, wherein said gear train comprises a partial gear having an actuation lever, a first gear meshing with said partial gear, and a second gear meshing with said first gear, said gear train supported in a gear-train housing.

8. The apparatus of claim 7 wherein said gear train further includes timing marks formed on said partial gear, said first gear, and said second gear to synchronized said gear train during assembly.

9. The apparatus of claim 8 wherein the timing marks synchronizing said partial gear and said first gear have smooth surfaces whereas the timing marks synchronizing said first gear and said second gear have angular surfaces.

10. The apparatus of claim 7 wherein said second gear incorporates a lockout cam ring formed to prevent engagement of said second gear and said rack profile by interfering with a lockout key located at the proximal end of said guide rail when said second gear is not synchronized with said rack profile.

11. The apparatus of claim 10 wherein said second gear is preloaded by a spring to eliminate backlash in said gear train, said spring biasing said gear train so that said actuation lever is in a horizontal position prior to insertion of said drive carrier into said computer chassis.

12. The apparatus of claim 11 wherein said second gear can engage said rack profile when said actuation lever is in said horizontal position since said lockout cam ring clears said lockout key.

13. The apparatus of claim 7 wherein said partial gear further includes a flared tooth member that engages snaps attached to said gear-train housing when said drive carrier is fully docked in said drive bay to provide tactile feedback through said actuation lever.

14. An apparatus for docking a plurality of mass-storage drives in a computer chassis, said apparatus comprising:

a plurality of guide rails rigidly and demountably installed in a computer chassis, each of said plurality of guide rails having a rack profile formed at a proximal end thereof; and a plurality of drive carriers each having an alignment groove formed to slidingly engage one of said plurality of guide rails;

a gear train including a partial gear having an actuation lever, a first gear meshing with said partial gear, and a second gear meshing with said first gear, said gear train supported in a gear-train housing;

a printed circuit board that merges separate power and data connectors of each of a plurality of removable mass-storage drives into a single docking connector having registration pins and blind-matable to said computer chassis, said printed circuit board movably and demountably attached to said drive carrier; and a plurality of ribs formed in each drive bay of said computer chassis to support each of said plurality of drive carriers.

15. The apparatus of claim 14 wherein said gear train further includes timing marks formed on said partial gear, said first gear, and said second gear to synchronize said gear train during assembly, said second gear incorporating a lockout cam ring formed to prevent engagement of said second gear and said rack profile by interfering with a lockout key located at said proximal end when said second gear is not synchronized with said rack profile.

16. The apparatus of claim 15 wherein said second gear is preloaded by a torsion spring to eliminate backlash in said gear train, said torsion spring biasing said gear train so that said actuation lever is in a horizontal position prior to insertion of said plurality of drive carriers into said chassis, said lockout cam ring clearing said lockout key when said actuation lever is in said horizontal position and allowing engagement of said second gear and said rack profile, said partial gear further including a flared tooth member that engages snaps attached to said gear-train housing when said plurality of drive carriers is fully docked in a computer chassis to provide tactile feedback through said actuation lever.

17. The apparatus of claim 16 wherein each of said plurality of drive carriers is capable of utilizing any one of a plurality of interchangeable front panels having various geometries to be able to accommodate a plurality of mass-storage drives of different types and configurations, each of said plurality of drive carriers and each of said plurality of interchangeable front panels further including electromagnetic-radiation shields grounding each of a plurality of mass-storage drives to a computer chassis.

* * * * *